(12) United States Patent
Pham et al.

(10) Patent No.: US 10,063,190 B2
(45) Date of Patent: Aug. 28, 2018

(54) BROADBAND DOHERTY POWER AMPLIFIER

(71) Applicant: Telefonaktiebolaget LM Ericsson (publ), Stockholm (SE)

(72) Inventors: Bi Pham, Ottawa (CA); Carl Conradi, Ottawa (CA); John Ilowski, Nepean (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/508,151

(22) PCT Filed: Sep. 11, 2014

(86) PCT No.: PCT/IB2014/064449
§ 371 (c)(1),
(2) Date: Mar. 2, 2017

(87) PCT Pub. No.: WO2016/038426
PCT Pub. Date: Mar. 17, 2016

(65) Prior Publication Data
US 2017/0288613 A1    Oct. 5, 2017

(51) Int. Cl.
*H03F 1/02*    (2006.01)
*H03F 3/193*    (2006.01)
(Continued)

(52) U.S. Cl.
CPC ............. *H03F 1/0288* (2013.01); *H03F 1/56* (2013.01); *H03F 3/193* (2013.01); *H03F 3/21* (2013.01);
(Continued)

(58) Field of Classification Search
USPC ........... 330/295, 124 R, 84, 286, 53–54, 302
See application file for complete search history.

(56) References Cited

U.S. PATENT DOCUMENTS

| | | | |
|---|---|---|---|
| 8,198,938 B2* | 6/2012 | Yu | ......................... H03F 1/0288 330/124 R |
| 8,593,219 B1 | 11/2013 | Root | |

(Continued)

FOREIGN PATENT DOCUMENTS

EP    2 698 918 A1    2/2014

OTHER PUBLICATIONS

International Search Report and Written Opinion dated Jul. 17, 2015 for International Application Serial No. PCT/IB2014/064449, International Filing Date—Sep. 11, 2014 consisting of 18-pages.

*Primary Examiner* — Hieu Nguyen
(74) *Attorney, Agent, or Firm* — Sage Patent Group

(57) ABSTRACT

A power amplifier circuit includes a main amplifier circuit having a main amplifier for amplifying an input signal in one of a full-power mode and at least a back-off mode. A first peak amplifier circuit is in parallel with the main amplifier circuit. The first peak amplifier circuit has a peak amplifier in series with a transmission line. The peak amplifier is configured to be activated in the full-power mode and to be de-activated in at least the back-off mode. A combining node is connected to an output of the main amplifier circuit and an output of the transmission line. In some embodiments, a matching network is connected at the output of the combining node. In some embodiments, the transmission line is selected so the first peak amplifier circuit appears substantially as an open circuit to the combining node.

9 Claims, 10 Drawing Sheets

(51) Int. Cl.
  *H03F 3/21*    (2006.01)
  *H03F 1/56*    (2006.01)
(52) U.S. Cl.
  CPC .. *H03F 2200/423* (2013.01); *H03F 2200/451* (2013.01)

(56) References Cited

U.S. PATENT DOCUMENTS

| | | |
|---|---|---|
| 2010/0141338 A1 | 6/2010 | Yu |
| 2013/0241639 A1 | 9/2013 | Wilson et al. |
| 2013/0241657 A1 | 9/2013 | Cho et al. |
| 2016/0315587 A1* | 10/2016 | Zhang .................. H03F 1/0288 |

* cited by examiner

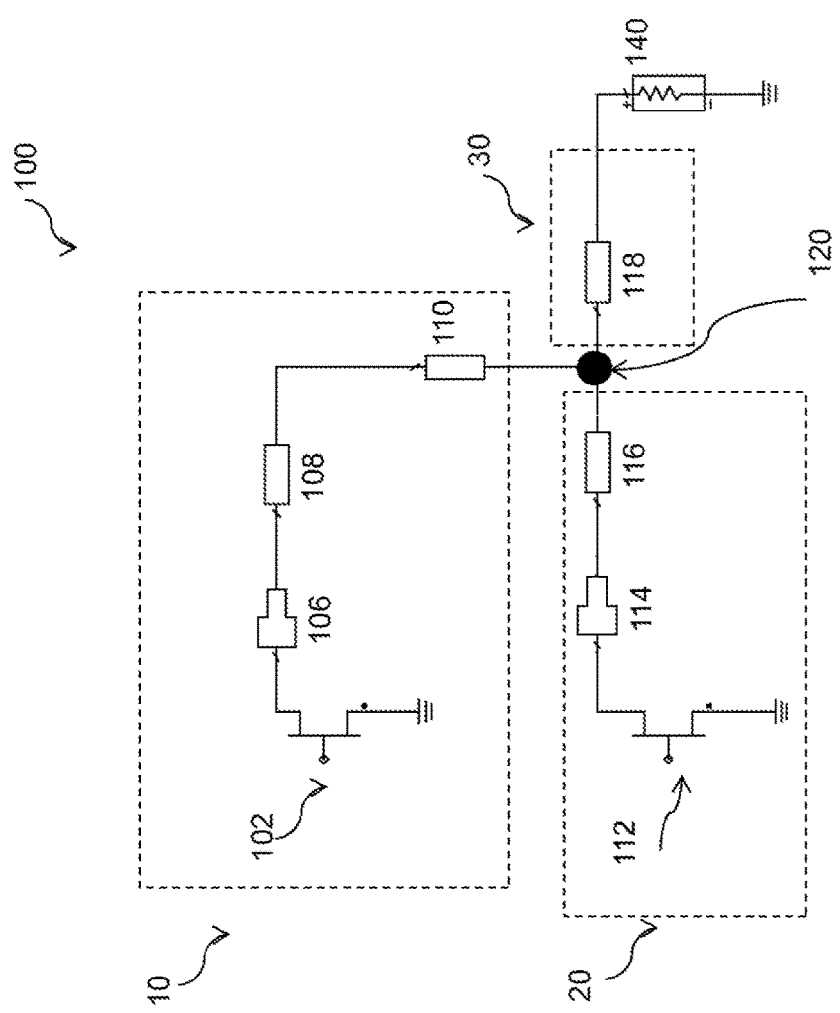
FIGURE 1- PRIOR ART

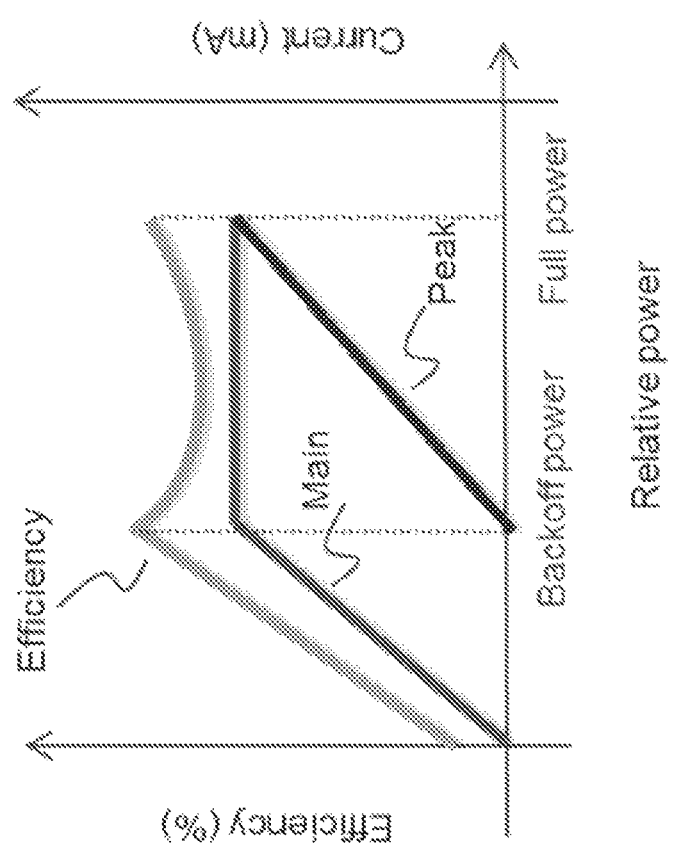
FIGURE 2- PRIOR ART

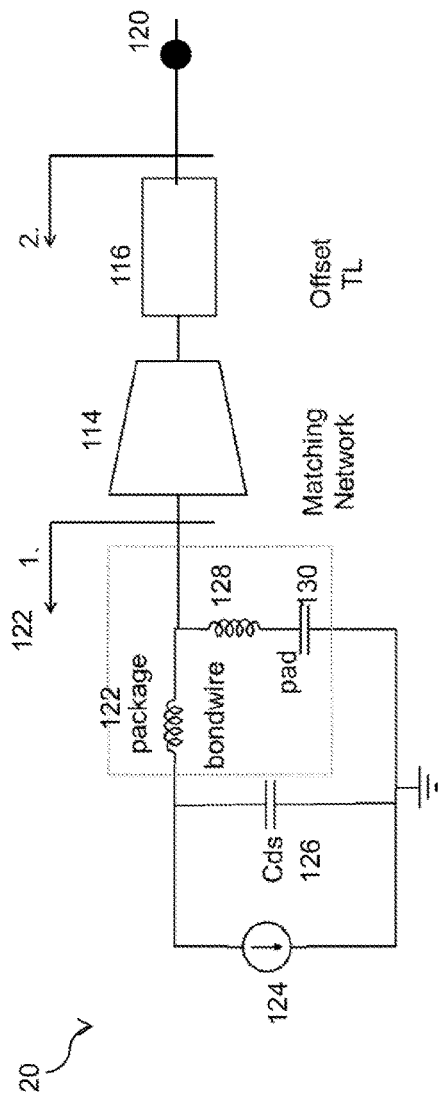
FIGURE 3A – PRIOR ART
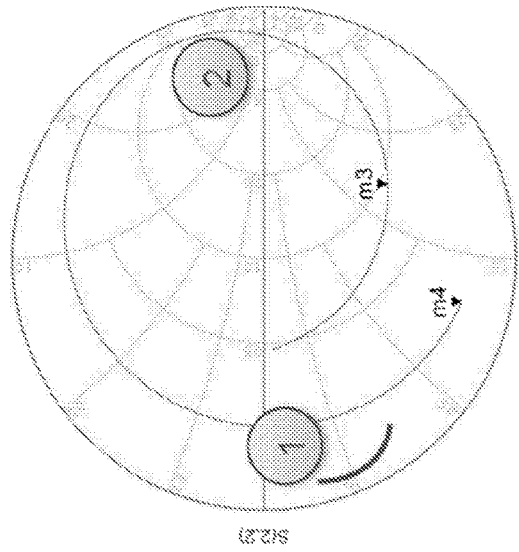
FIGURE 3B-PRIOR ART

BROADBAND DOHERTY POWER AMPLIFIER

CROSS-REFERENCE TO RELATED APPLICATIONS

This application is a Submission Under 35 U.S.C. § 371 for U.S. National Stage Patent Application of International Application No. PCT/IB2014/064449, filed Sep. 11, 2014, entitled "BROADBAND DOHERTY POWER AMPLIFIER," the entirety of which is incorporated herein by reference.

FIELD OF THE DISCLOSURE

The present invention generally relates to power amplifier circuits, and more particularly to Doherty amplifier configurations with improved bandwidth.

BACKGROUND

In today's 3rd- and 4th-generation wireless communication systems, complex modulation schemes are used to improve the spectral efficiency of the signals and thus increase system capacity and throughput. In contrast to the constant envelope signals used in earlier wireless systems, the signals in these high-speed wireless networks typically have high peak-to-average power ratios. As a result, the power amplifiers used in system transmitters must be operated in modes that are more linear, but thus less efficient. To increase the efficiencies of the power amplifier system, which in turn reduces system temperatures and power consumption, the well-known Doherty power amplifier (PA) circuit is commonly used. Often a feed-forward or feed-back system allows the amplifier to operate closer to the saturation region for achieving higher efficiency.

FIG. 1 illustrates a diagram of a conventional Doherty PA circuit 100. The Doherty PA circuit 100 has two amplifiers circuits in parallel: a main amplifier circuit 10 comprising a main amplifier 102 and a peak amplifier circuit 20 comprising a peak amplifier 112. Amplifier circuits 10 and 20 each amplify an input signal provided to the two amplifier circuits via an input signal splitting network (not shown). The outputs from amplifier circuits 10 and 20 are combined at a combining node 120 and provided to a combining network 30 which outputs the amplified signal to an external load 140. Amplifier 102 is called 'main amplifier' (or simply 'main'), because it provides amplification across all instantaneous output powers. Amplifier 112 is called 'peak amplifier' (or simply 'peak') as it only contributes power only after the main amplifier 102 saturates. The operating mode in which only the main amplifier 102 supplies the desired output power and the peak amplifier 112 is deactivated (or in an off state) is called a back-off mode (or back-off state or back-off regime). When both amplifiers are activated (or 'on'), the operating mode is called a full-power mode. Amplifiers 102 and 112 are each presented at their output with an impedance that is optimal for their respective rated output power.

In order to match impedances for achieving maximum power transfer from the amplifiers 102 and 112, matching networks 106 and 114 are required. An impedance inverter 110 is used within the main circuit 10 to address the load modulation caused by the peak amplifier 112. Within the combining network 30, a transmission line 118 is used to transform the intermediate impedance at combining node 120 to the overall impedance of the amplifier circuit 100 required by the system. Occasionally, a short transmission line 116 is required to transform the impedance of peak amplifier circuit 20 to a high impedance, when amplifier 112 is in the off state. This prevents RF (radio-frequency) power from the main circuit 10 from leaking to the peak circuit 20 and from detuning the optimal load impedance seen by the main amplifier circuit 10.

FIG. 2 illustrates general efficiency and current curves with respect to relative powers for the amplifier circuits 10, 20 and the overall Doherty PA circuit 100. The Doherty power amplifier circuit 100 achieves overall high efficiency by turning on the peak amplifier 112 whenever the envelope of the input signal peaks. The current generated from the load of the peak amplifier 112 modulates the output load of the main amplifier 102, keeping the voltage swing high and keeping the main 102 operating in the high-efficiency region. When the Doherty PA circuit 100 operates at full power, main 102 is designed to see optimal impedance. When the Doherty PA circuit 100 operates at back-off power, the main amplifier 102 sees an impedance of twice the load impedance. The variation in load impedance associated with full power and back-off power operation improves the overall efficiency of the Doherty PA circuit 100.

For the Doherty power amplifier circuit 100 to be operating at the highest efficiency at back-off power, it relies on the peak amplifier circuit 20 to be completely off and isolated from the main amplifier circuit 10 at the combining node 120. This is achieved by designing the peak amplifier circuit 10 such that its impedance, when observed from the combining node 120, is ideally open such that no RF power from the main amplifier circuit 10 can leak through the peak circuit 20. However, with the configuration in FIG. 1, such design is only achievable for a narrow band of frequencies. This prevents the Doherty PA circuit of FIG. 1 from operating over wide bandwidths and from being used for multiband/dual band applications with high efficiency and linearity.

SUMMARY

Several of these problems can be reduced using new Doherty power amplifier circuit configurations disclosed herein and detailed below. These configurations solve bandwidth limitation of the peak amplifier allowing for a Doherty power amplifier to operate at a much wider bandwidth. The wideband aspect of these configurations enables multiband/dual band operation with high efficiency and linearity.

According to some configurations, the matching network of the peak circuit 20 and the combiner network 30 are combined into one functional unit. According to further configurations, the narrowband off-state impedance of the peak is made wider by moving the matching network after the combiner node 120.

According to further configurations, the output capacitance of the peak amplifier 112 device is absorbed as part of a transmission line transforming the peak amplifier circuit impedance to an open. Accordingly, the frequency dispersion caused by both the output capacitance of the peak amplifier 112 and the matching network in the peak circuit 20 in the conventional Doherty PA circuit 100 is substantially reduced.

According to further configurations, matching networks for the main and peak power amplifiers circuits are combined in a shared matching network after the combining node 120.

According to some embodiments, a power amplifier circuit for providing an amplified signal is provided. The power amplifier circuit comprises a main amplifier circuit comprising a main amplifier configured to amplify an input signal in one of a full-power mode and at least a back-off mode, a first peak amplifier circuit in parallel with the main amplifier circuit, the first peak amplifier circuit comprising a peak amplifier in series with a transmission line, the peak amplifier configured to be activated in the full-power mode and to be de-activated in at least the back-off mode, and a combining node connected to an output of the main amplifier circuit and an output of the transmission line. In some embodiments, the amplifier circuit further comprises a matching network connected at the output of the combining node, wherein the matching network is selected to match a combined load of the main amplifier circuit and the peak amplifier circuit in full power mode over a wide frequency band. In some embodiments, the transmission line is selected such that the first peak amplifier circuit appears substantially as an open circuit to the combining node.

According to some embodiments, the transmission line forms a substantially quarter wavelength transmission line. According to some further embodiments, a parasitic capacitance of the peak amplifier is absorbed within the transmission line.

According to some embodiments, the matching network is selected using complex broadband matching techniques independent of an off state impedance of the peak amplifier circuit.

According to some embodiments, the transmission line has a high Q characteristic and the matching network has a low Q characteristic.

According to some embodiments, the power amplifier circuit further comprising one or more additional peak amplifier circuits in parallel with the main amplifier circuit and the first peak amplifier circuit and configured to operate in an analogous way as the first peak amplifier circuit.

BRIEF DESCRIPTION OF THE DRAWING FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 illustrates a conventional Doherty power amplifier circuit.

FIG. 2 illustrates general efficiency and current curves with respect to relative powers for the amplifier circuits and the overall Doherty power amplifier circuit in FIG. 1.

FIG. 3A illustrates a more detailed diagram of the peak amplifier circuit of the Doherty power amplifier circuit in FIG. 1;

FIG. 3B is a Smith chart of the impedance at a couple of points within the peak amplifier circuit in FIG. 3A;

DETAILED DESCRIPTION

Figure 4A:
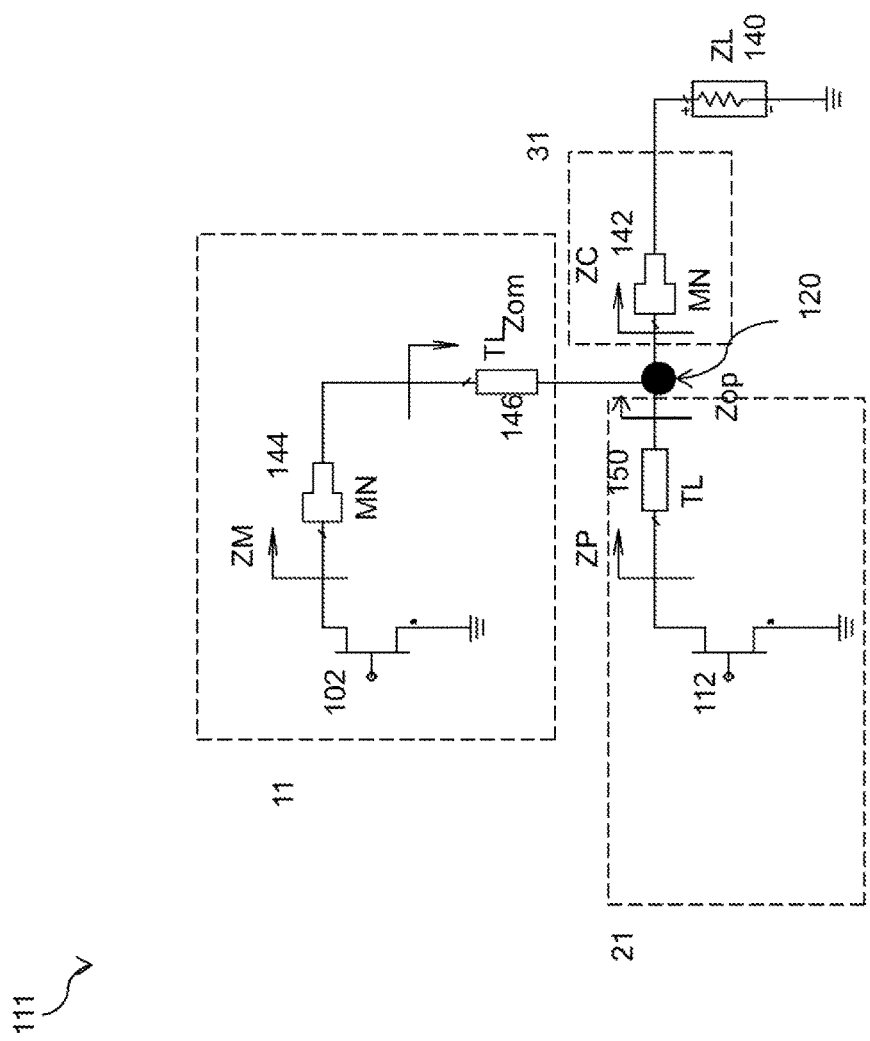
FIG. 4A illustrates a Doherty power amplifier circuit according to some embodiments of the present disclosure.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

To enable a better understanding of the new embodiments described, prior art FIG. 3A illustrates the peak amplifier circuit 20 in the Doherty power amplifier circuit 100 in FIG. 1. Specifically, a model of the amplifier 112 includes parasitic components (mostly due to packaging and also the intrinsic drain capacitance), which make the wideband design challenging. In particular, the peak amplifier 112 can be modelled as including a current source 124, a drain capacitance, $C_{ds}$ 126, a package inductance 122, a bondwire inductance 128 and a pad parasitic capacitance 130. The output of the package inductance 122 is followed in series by the matching network 114 which is followed by the short transmission (offset) line 116 for offset transformation to high impedance. In the conventional Doherty in FIGS. 1 and 3A, matching network 114 is used to transform the high impedance seen by the combiner node 120 to a low optimal impedance at the output of the peak amplifier 112. For broadband match, this requires matching network to have a low Q factor, thus the matching network 114 consists of multiple elements, each adding additional phase dispersion. Transmission line 116 follows the matching network 114 for phase alignment to ensure that the combining node 120 sees a high impedance of the peak circuit 20 at the center of the band for high isolation when the Doherty PA circuit 100 is operating in back-off mode. The transmission line 116 is a high Q element whose purpose is to not affect the matching impedance but add an appropriate phase delay to achieve the high impedance at the combining node 120.

When plotted on a Smith chart, as shown in FIG. 3B, the output impedance of the peak 112 after the package inductance 122 has a very low impedance, denoted with $Z_1$. This is mainly due to the drain capacitance $C_{ds}$ 126 of the peak device 112. After the matching network 114 and offset line 116, the impedance $Z_1$ is transformed to a high impedance $Z_2$. Since the components used are dispersive in nature, the transformation to a high-impedance only holds for a narrow bandwidth of frequencies. It can be seen that the design of the peak circuit in FIG. 3A presents several drawbacks, some interrelated, as follows:

The peaking amplifier circuit 120 is observed as high impedance only for a small bandwidth at the combining node 120.

The transmission line 116 is practical only for a narrow bandwidth due to the dispersive impedance caused by $C_{ds}$ 126 and the matching network 114. This aspect becomes more prominent as $C_{ds}$ 126 becomes larger, in amplifiers with a higher rated output power.

Thus, an efficient performance broadband Doherty power amplifier design cannot be achieved with the circuit in FIG. 3A due to the loading of the peaking amplifier circuit 20 on the main circuit 10 in the back-off mode.

Several of these problems can be reduced using the new Doherty power amplifier configurations disclosed herein and detailed below.

According to some embodiments, a power amplifier circuit for providing an amplified signal is provided. The power amplifier circuit comprises a main amplifier circuit comprising a main amplifier configured to amplify an input signal in one of a full-power mode and at least a back-off mode, a first peak amplifier circuit in parallel with the main amplifier circuit, the first peak amplifier circuit comprising a peak amplifier in series with a transmission line, the peak amplifier configured to be activated in the full-power mode and to be de-activated in at least the back-off mode, and a combining node connected to an output of the main amplifier circuit and an output of the transmission line. In some embodiments, the amplifier circuit further comprises a matching network connected at the output of the combining node, wherein the matching network is selected to match a combined load of the main amplifier circuit and the peak amplifier circuit in full power mode over a wide frequency band. In some embodiments, the transmission line is selected such that the first peak amplifier circuit appears substantially as an open circuit to the combining node.

According to some embodiments, the transmission line forms a substantially quarter wavelength transmission line. According to some further embodiments, a parasitic capacitance of the peak amplifier is absorbed within the transmission line.

According to some embodiments, the matching network is selected using complex broadband matching techniques independent of an off state impedance of the peak amplifier circuit.

According to some embodiments, the transmission line has a high Q characteristic and the matching network has a low Q characteristic.

According to some embodiments, the power amplifier circuit further comprising one or more additional peak amplifier circuits in parallel with the main amplifier circuit and the first peak amplifier circuit and configured to operate in an analogous way as the first peak amplifier circuit.

FIG. 4A illustrates a diagram of a new power amplifier circuit 111 according to an embodiment of the present disclosure. The power amplifier circuit 111 includes a main amplifier circuit 11 and a peak amplifier circuit 21 in parallel with the main amplifier circuit 11. The outputs from amplifier circuits 11 and 21 are combined at a combining node 120 and provided to a combining network 31 which outputs the amplified signal to an external load 140. The main amplifier circuit 11 includes a main amplifier 102 configured to amplify an input signal in one of a full-power mode and at least a first back-off mode. The peak amplifier circuit 21 comprises a peak amplifier 112 configured to be activated in the full-power mode and to be de-activated in at least the first back-off mode.

The peak amplifier circuit 21 also comprises a transmission line 150 in series with an output of the peak amplifier 112. The transmission line 150 is chosen such that the peak amplifier circuit 21 appears substantially as an open circuit to the combining node 120. In some embodiments, a parasitic (or output) capacitance of the peak amplifier 112 (equivalent to $C_{ds}$ 126 in FIG. 1, not shown in FIG. 4A) is absorbed within the transmission line 150. In some embodiments, transmission line 150, when accounting for the absorbed parasitic capacitance of the peak amplifier 112, is substantially equivalent to a quarter-wave transmission line.

Figure 4B:
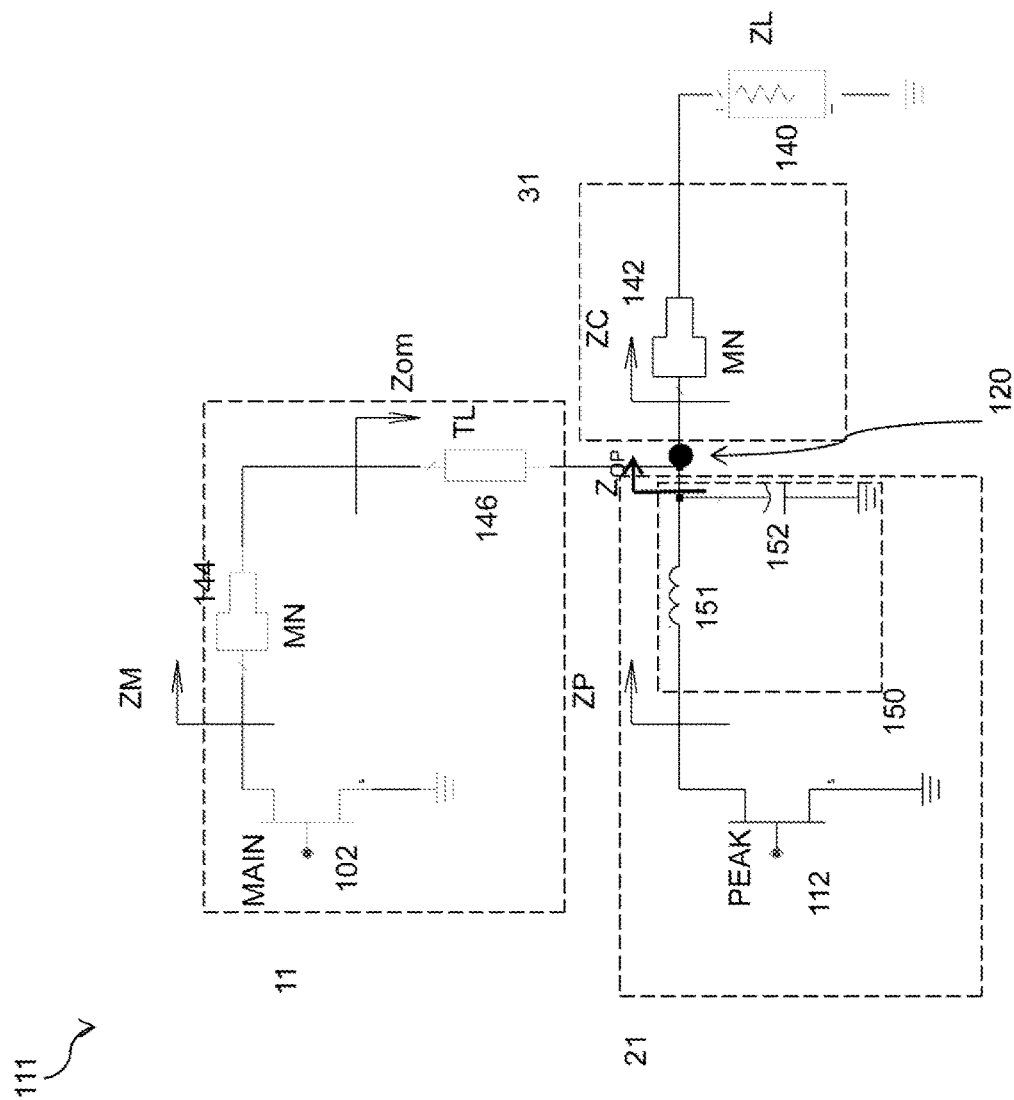
FIG. 4B illustrates a Doherty power amplifier circuit according to other embodiments of the present disclosure.

The absorption of $C_{ds}$ can be understood considering a pi-model of a transmission line, which includes a first shunt capacitance, a series inductance and a second shunt capacitance. Thus $C_{ds}$ can be at least partially absorbed within a transmission line, in being considered at least part of a first shunt capacitance within such a model. Suitable absorption of $C_{ds}$ can be achieved with the embodiment shown in FIG. 4B, where $C_{ds}$ (not explicitly shown), the series inductance 151 and the shunt capacitor 152 act as a transmission line. FIG. 4B will be discussed in more detail below.

In contrast to the Doherty PA 100 in FIG. 1, in the Doherty PA 111, the low Q peak matching network 114 is provided after the combining node 120, shown by 142, and integrated in the combiner network 31. This enables the peak device to only see the transmission line 150 which has a high Q characteristic. The length of the transmission line 150 is used to transform the impedance of the peak amplifier circuit 21 to a high impedance when viewed from the combining node 120.

This allows the narrowband off-state impedance of the peak, $Z_2$, (see FIG. 3A), to be made wider. The removal of the matching network 114 from the peak circuit 21 (with new matching network 142 provided after the combining node) and the absorption of the output capacitance of the peak 112 within transmission line 150 allow for a reduction in the frequency dispersion in impedance $Z_2$ in FIG. 3A caused by both $C_{ds}$ 126 and the matching network 114 in the Doherty PA circuit 100 in FIG. 1.

Matching network 142 following the combiner node 120 provides partial impedance matching for the main amplifier circuit 11 and impedance matching for the peak amplifier circuit 21.

FIG. 4B shows an alternate embodiment according to the present disclosure. In FIG. 4A, peak circuit 21 is designed using only a transmission line 150 to provide a high off-state. In FIG. 4B, the transmission line 150 is shown in lump element form as an inductor 151 and a capacitor 152. The parasitic output capacitance $C_{ds}$ of the peak amplifier 112 is absorbed along with an inductor 151 and capacitor 152 to form a pseudo 'transmission line'.

Referring to FIGS. 4A and 4B, the full matching network for the main amplifier 102 consists of matching network 154, transmission line 153 and matching network 142. Matching network 154 is used to optimize for the load impedance observed by the main amplifier 102 at both full power and back-off power. The matching network for the peak amplifier 112 includes transmission line 150 and matching network 142. In this embodiment, transmission line 146 within the main amplifier circuit 11 has its output connected at the combining node 120 where the peak amplifier circuit 21 is transformed to its high off-state impedance. Transmission line 154 is used to transform the intermediate impedance from matching network 142 (ZC) to an impedance that is closer to the optimal load for the main amplifier 102. A second matching network 144 at the output of the main amplifier 102 is part of the overall matching network for this amplifier.

Figure 4C:
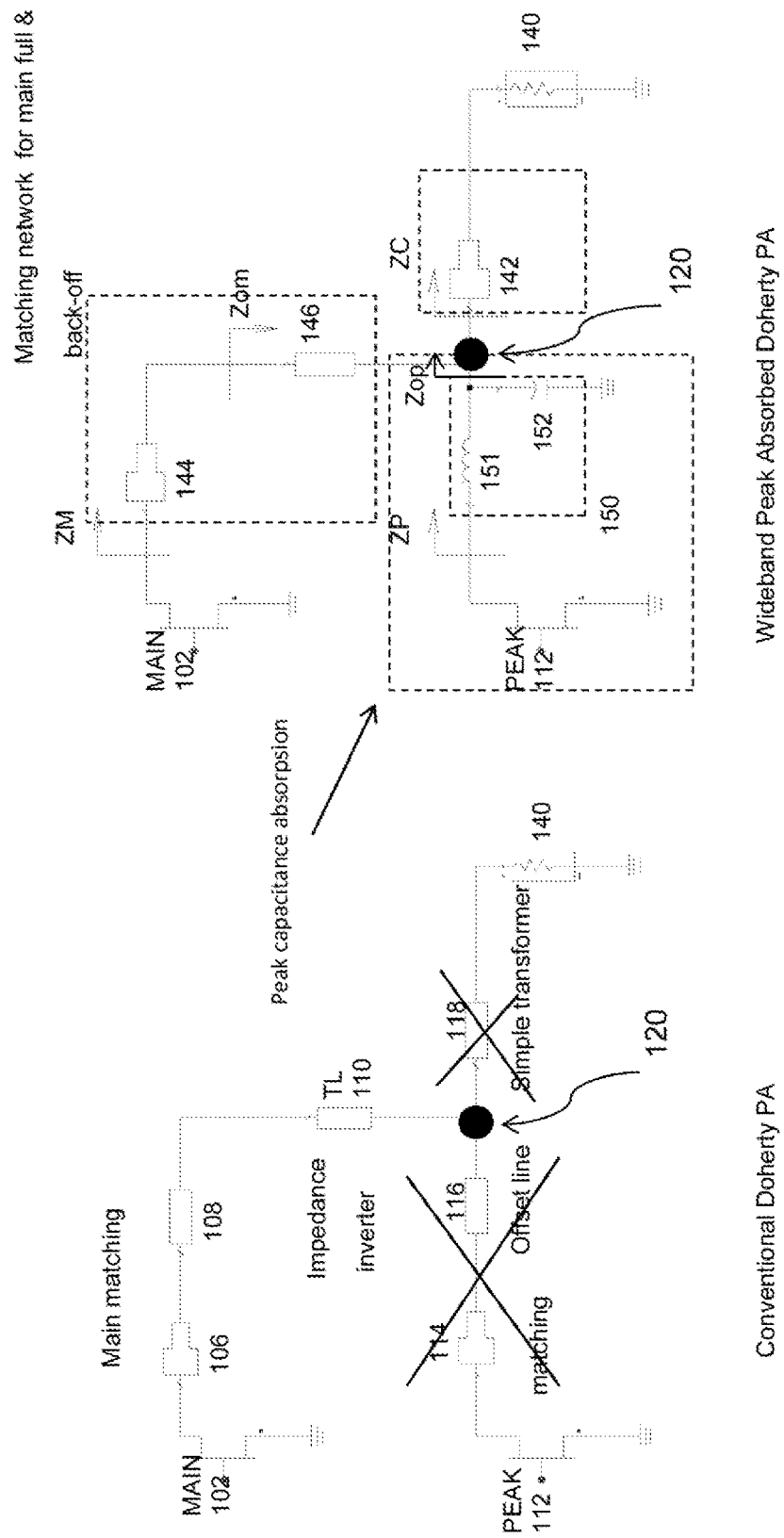
FIG. 4C illustrates modifications to the conventional Doherty power amplifier circuit in FIG. 1 to arrive at the Doherty amplifier circuit in FIG. 4A.

FIG. 4C summarizes the transformation of the Doherty PA circuit configuration in FIG. 1 to the PA configuration in FIG. 4A.

Figure 4D:
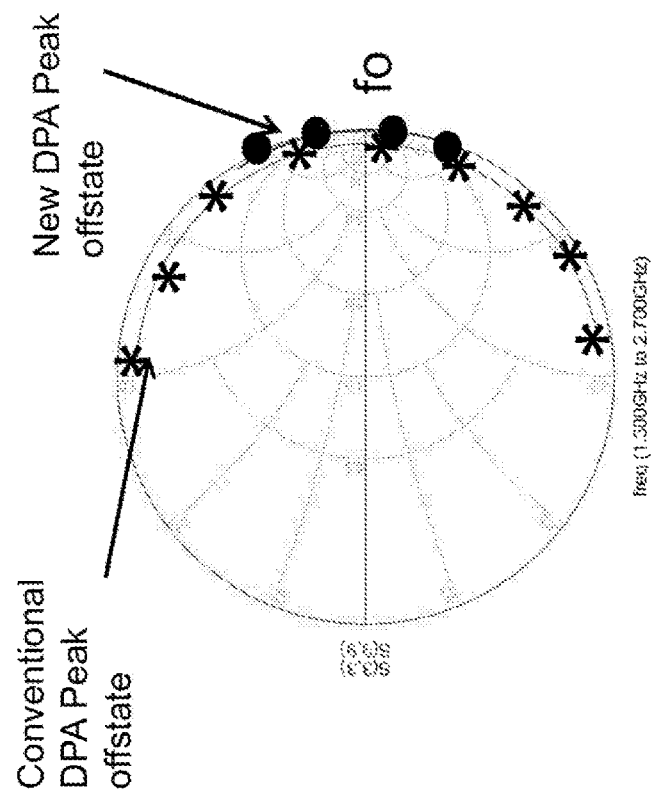
FIG. 4D illustrates a Smith chart showing the off-state impedance of the peak power amplifier after the impedance transformation to the impedance of a substantially open circuit (known as off-state impedance)

FIG. 4D illustrates a Smith chart showing the off-state impedance of the peak power amplifier after the impedance transformation to an open circuit (known as off-state impedance). The line with '*' markers corresponds to the peak circuit 20 output impedance in the conventional Doherty PA in FIG. 1 and the line with '•' markers corresponds to the transmission line impedance transformation in the PA in FIG. 4B, in which the peak's 112 parasitic capacitance is absorbed as part of the transmission line 150.

Referring back to FIGS. 4A and 4B, the overall matching network for both full power and back-off power modes of operation for the main amplifier 102 includes matching network 144, transmission line 146 and matching network 142. Matching network 142 is designed to match the peak amplifier 112 at full power. At full power the impedance presented to the peak amplifier circuit 21 is dependent on the modulation ratio between the main and peak amplifiers 102 and 112 shown as $$\left(1 + \frac{Imain}{Ipeak}\right) \cdot ZC,$$

where Ipeak is the max current from peak amplifier 112 and Imain is the max current from main amplifier 102. For the main amplifier circuit 21, the impedance observed at the combining node 120 is ZC at back off power mode and $$\left(1 + \frac{Ipeak}{Imain}\right) \cdot ZC$$

at full power. For a symmetric Doherty PA, the impedance at the combining node 120 is 2*ZC for full power mode due to contribution of the current from the peak amplifier 112. Transmission line 150 is connected to ZC after $Z_{OP}$ (which is the equivalent impedance of the peak amplifier circuit 21). As discussed above, the peak amplifier circuit 21 is seen as high impedance to prevent any loading to the main amplifier circuit 11. Although not necessary, transmission line 146 can have the same phase and characteristic impedance as transmission line 150 in the peak circuit 21, to simplify the design. Another embodiment is to have transmission line 146 equal to a quarter-wave transmission line, in which case final matching can be done at matching network 144.

In the novel configurations described herein, the peak circuit matching network is part of the combiner network leading to wideband capabilities.

Furthermore, in the new configurations described herein, complex broadband matching techniques may be realized for the peak amplifier circuit 21 without affecting (or independent of) the high off-state impedance of the peak amplifier circuit 21 in back-off power mode.

The peak amplifier circuit 21 presents a much wider high off state impedance at back-off. This allows very high isolation, minimizing RF leakage from the main circuit 11 enabling the main amplifier 102 to operate at optimal performance across a wider bandwidth.

Figure 5:
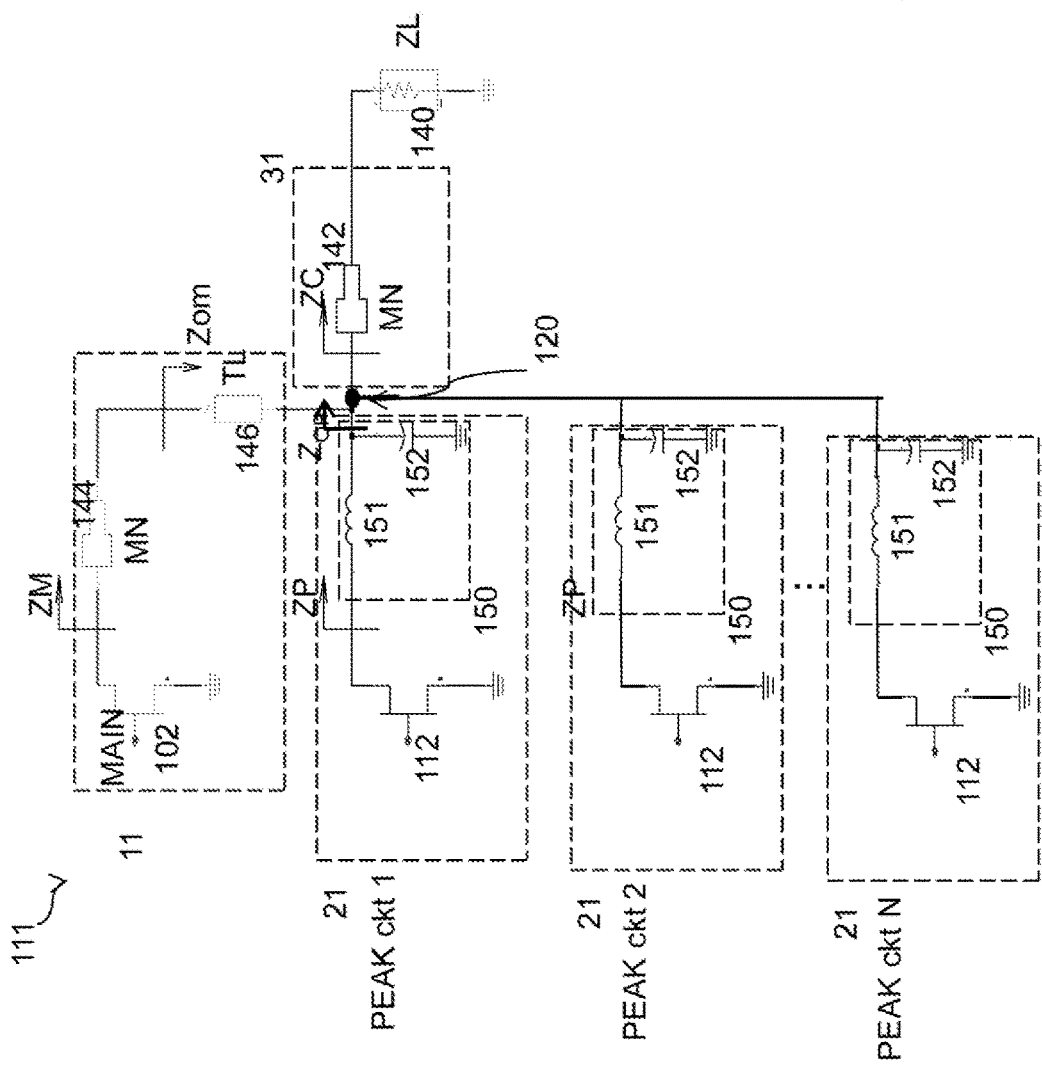
FIG. 5 illustrates an N-way Doherty power amplifier circuit according to an embodiment of the present disclosure.

Referring to FIG. 5, the amplifier configurations described herein may be extended to include two (or more) peak amplifier circuits Peak 1, Peak 2, . . . Peak N. Each peak circuit Peak K (K=1 . . . N) is connected at the combining node 120. A simple matching network (not shown) may optionally be added within each peaking circuit 21 to fine tune the matching to obtain various Zopt at different power modes.

FIGS. 6A, 6B and 7A and 7BA were derived from a computer simulation performed to assess improvements of the Doherty PA circuit in FIGS. 4A-4C compared to the Doherty PA circuit in FIG. 1. The calculations are based on the maximum power transfer theorem where maximum power transfer is achieved when the source and load are conjugate matched. Assuming the main device, at back off power, is conjugate matched to Zopt, power transfer is 100% (efficient), i.e. there is no power loss. The results are shown in FIGS. 6A, 6B, 7A, 7B.

Figure 6B:
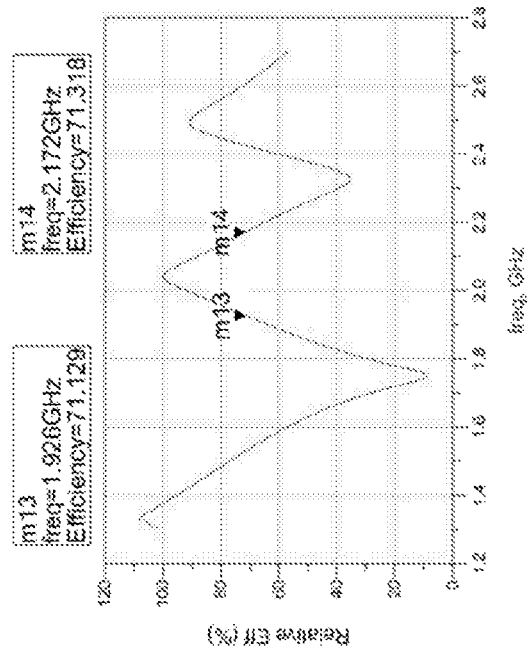
FIG. 6B illustrates a plot of relative efficiency degradation for the conventional Doherty PA at back-off mode in FIG. 1.
Figure 6A:
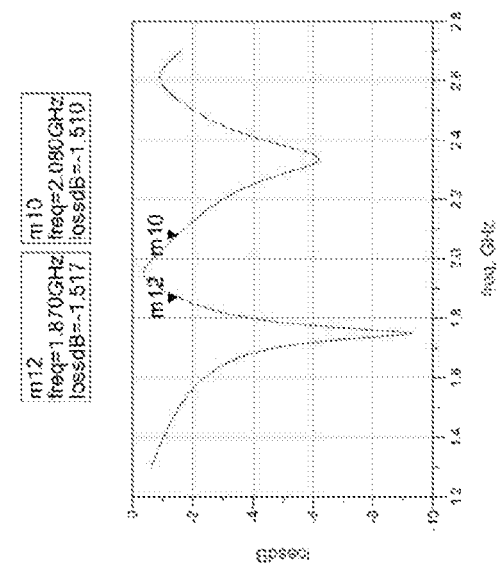
FIG. 6A illustrates a plot of relative power degradation for the conventional Doherty PA at back-off mode in FIG. 1.
Figures 7A, 7B:
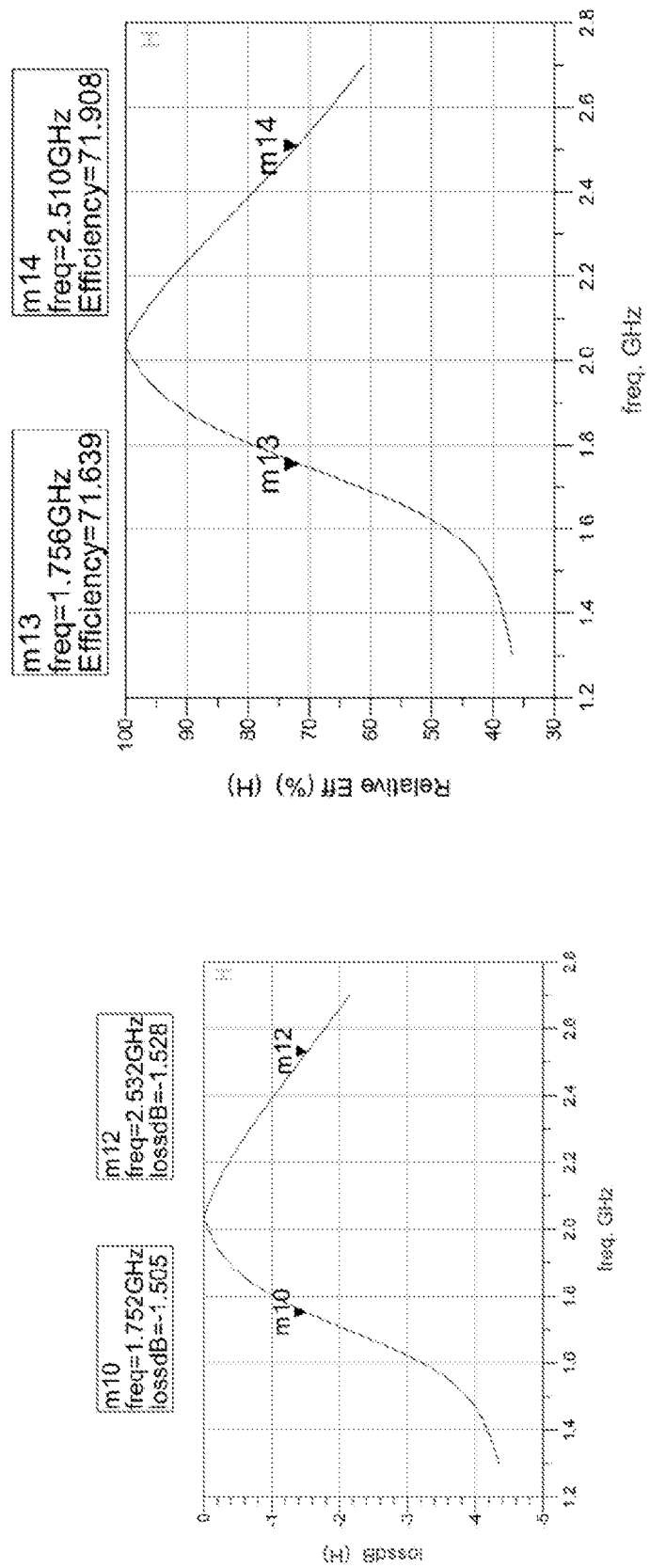
FIGS. 7A and 7B are plots corresponding to plots in FIGS. 6A and 6B, respectively, based on the Doherty PA circuit configuration shown in FIG. 4C.

FIG. 6A illustrates a plot of relative power degradation for the conventional Doherty PA 100 in FIG. 1. The plot shows that for a conventional Doherty at a reference of 1.5 dB loss (y-values of markers m12 and m10) due to power leakage to the peak amplifier, the power amplifier has a 10.63% bandwidth. At this bandwidth, there is approximately 29% efficiency degradation for the main amplifier due to power leakage to the peak circuit 20.

FIG. 6B illustrates a plot of relative efficiency degradation for the conventional Doherty PA. It can be seen that a bandwidth corresponding to a relative efficiency of 71% (i.e. y values of markers m13 and m14) is approximately 0.24 GHz (=2.17 GHz-1.93 Ghz).

FIGS. 6A and 6B are plots corresponding to plots in FIGS. 5A and 58, respectively, based on the new Doherty PA configurations in FIGS. 4A-4C. In the wideband Doherty PA topology of FIG. 4C, the peak presents closer to an ideal open circuit. Loss is reduced as shown in FIG. 6A. At the same 1.5 dB power loss reference, the bandwidth of the new wideband Doherty PA extends from 1.75 GHz to 2.51 GHz for a bandwidth of 35.3%. An improvement of 35.3/10.63=332% is thus obtained.

FIG. 6B illustrates efficiency degradation across bandwidth for the new Doherty PA in FIGS. 4A-4C. In this case, a bandwidth corresponding to the same relative efficiency of 71% (i.e. y values of markers m13 and m14) is now approximately 0.754 GHz (=2.51 GHz-1.756 Ghz).

Based on the above, it can be concluded that advantages of the new Doherty PA configurations disclosed herein may include:

Close to ideal off-state impedance of the peak at the combiner node;

Almost no combiner loss for narrowband operation;

High isolation of peak to main amplifier at back-off preventing power leakage and efficiency degradation to peak over a wideband. This may result in better performance of the main amplifier and improved linearity and efficiency;

Multiband/dual band capability may be increased without sacrificing performance. No design complexity such as dual phase compensation components may be required;

3.32× bandwidth improvement compared to a conventional Doherty PA may be obtained for certain new Doherty PA configurations described herein.

Several example circuits have been illustrated and described in detail, to convey the principles and operation of the present invention. Those skilled in the art will appreciate that these circuits can be modified and adapted in various ways, while still operating according to these principles. Thus, it should be understood that the present invention is not limited by the details provided in the foregoing description, nor is it limited by the specific values, parameters, and features of the accompanying drawings. Instead, the present invention is limited only by the following claims and their legal equivalents.

What is claimed is:

1. A power amplifier circuit for providing an amplified signal, the power amplifier circuit comprising:

a main amplifier circuit comprising a main amplifier configured to amplify an input signal in one of a full-power mode and at least a back-off mode;

a first peak amplifier circuit in parallel with the main amplifier circuit, the first peak amplifier circuit comprising a peak amplifier in series with a transmission line, the peak amplifier configured to be activated in the full-power mode and to be de-activated in at least the back-off mode, wherein a parasitic capacitance of the peak amplifier is absorbed within the transmission line, thereby transforming an impedance of the first peak amplifier circuit to an open and the parasitic capacitance of the peak amplifier is substantially equivalent to a quarter-wave transmission line;

a combining node connected to an output of the main amplifier circuit and an output of the transmission line; and a matching network connected at the output of the combining node, the matching network being selected to match a combined load of the main amplifier circuit and the peak amplifier circuit in full power mode over a wide frequency band, wherein the matching network provides partial impedance matching for the main amplifier circuit and impedance matching for the first peak amplifier circuit.

2. The power amplifier circuit of claim 1, wherein the transmission line is selected such that the first peak amplifier circuit appears substantially as an open circuit to the combining node.

3. The power amplifier circuit of claim 2, wherein the transmission line forms a substantially quarter wavelength transmission line.

4. The power amplifier circuit of claim 1, wherein the matching network is selected using complex broadband matching techniques independent of an off state impedance of the peak amplifier circuit.

5. A power amplifier circuit for providing an amplified signal, the power amplifier circuit comprising:

a main amplifier circuit comprising a main amplifier configured to amplify an input signal in one of a full-power mode and at least a back-off mode;

a first peak amplifier circuit in parallel with the main amplifier circuit, the first peak amplifier circuit comprising a peak amplifier in series with a transmission line, the peak amplifier configured to be activated in the full-power mode and to be de-activated in at least the back-off mode, wherein a parasitic capacitance of the peak amplifier is absorbed within the transmission line, thereby transforming an impedance of the first peak amplifier circuit to an open and the parasitic capacitance of the peak amplifier is substantially equivalent to a quarter-wave transmission line; and a combining node connected to an output of the main amplifier circuit and an output of the transmission line, the transmission line being selected such that the first peak amplifier circuit appears substantially as an open circuit to the combining node.

6. The power amplifier circuit of claim 5, further comprising a matching network connected at the output of the combining node, wherein the matching network is selected to match a combined load of the main amplifier circuit and the peak amplifier circuit in full power mode over a wide frequency band, wherein the matching network provides partial impedance matching for the main amplifier circuit and impedance matching for the first peak amplifier circuit.

7. The power amplifier circuit of claim 5, wherein the transmission line forms a substantially quarter wavelength transmission line.

8. The power amplifier circuit of claim 1, wherein the transmission line has a high Q characteristic and the matching network has a low Q characteristic.

9. The power amplifier circuit of claim 1, further comprising at least one additional peak amplifier circuit in parallel with the main amplifier circuit and the first peak amplifier circuit and configured to operate in an analogous way as the first peak amplifier circuit.

* * * * *